US012658489B2

(12) United States Patent
Kim

(10) Patent No.: US 12,658,489 B2
(45) Date of Patent: Jun. 16, 2026

(54) METHOD, APPARATUS AND COMPUTER-READABLE MEDIUM FOR ESTIMATING STATE OF BATTERY USING RADIO FREQUENCY SIGNAL

(71) Applicant: SAMSUNG SDI CO., LTD., Yongin-si (KR)

(72) Inventor: Minsu Kim, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 154 days.

(21) Appl. No.: 18/405,255

(22) Filed: Jan. 5, 2024

(65) Prior Publication Data

US 2025/0096337 A1 Mar. 20, 2025

(30) Foreign Application Priority Data

Sep. 14, 2023 (KR) ........................ 10-2023-0122659

(51) Int. Cl.
*H01M 10/48* (2006.01)
*G01R 31/367* (2019.01)
(Continued)

(52) U.S. Cl.
CPC .......... *H01M 10/48* (2013.01); *G01R 31/367* (2019.01); *G01R 31/371* (2019.01); *G06N 3/08* (2013.01); *G01R 31/382* (2019.01); *G01R 31/392* (2019.01)

(58) Field of Classification Search
CPC ... H01M 10/48; G01R 31/367; G01R 31/371; G01R 31/392; G01R 31/382; G06N 3/08
(Continued)

(56) References Cited

U.S. PATENT DOCUMENTS 10,374,266 B2 * 8/2019 Mensah-Brown ...... B60L 58/20
11,658,350 B2 * 5/2023 Tomar ................... B60L 3/0046
429/7
(Continued)

FOREIGN PATENT DOCUMENTS

KR 10-2015-0049519 A 5/2015
KR 10-2053092 B1 12/2019
KR 10-2023-0051978 A 4/2023

OTHER PUBLICATIONS

Corrected entry—Zheng, et al., Understanding of Channel State Information (CSI), https://link.springer.com/chapter/10.1007/978-981-16-5658-3_2, Jun. 20, 2022 (first on-line Oct. 28, 2021).
(Continued)

*Primary Examiner* — Huy Q Phan
*Assistant Examiner* — Trung Q Nguyen
(74) *Attorney, Agent, or Firm* — Lee IP Law, P.C.

(57) ABSTRACT

A method of estimating a state of a battery cell provided in a battery pack includes obtaining, from a radio frequency (RF) antenna provided at opposite ends of the battery cell and configured to transmit and receive an RF signal, data regarding a phase and an amplitude of the RF signal, calculating an expansion coefficient of a jelly roll inside the battery cell based on the data regarding the phase and the amplitude of the RF signal, and estimating a state of the battery cell based on the expansion coefficient of the jelly roll. Corresponding apparatus and non-transitory computer-readable medium are also provided.

13 Claims, 11 Drawing Sheets

(51) Int. Cl.
  G01R 31/371 (2019.01)
  G06N 3/08 (2023.01)
  G01R 31/382 (2019.01)
  G01R 31/392 (2019.01)

(58) Field of Classification Search
  USPC ..................... 324/500, 600, 76.11, 415–430
  See application file for complete search history.

(56) References Cited

U.S. PATENT DOCUMENTS

| | | | | |
|---|---|---|---|---|
| 11,989,631 | B1 * | 5/2024 | Ozturk ................ | H01M 10/441 |
| 2017/0331160 | A1 | 11/2017 | Mensah-Brown et al. | |
| 2020/0280108 | A1 * | 9/2020 | Tomar ................. | H01M 10/482 |
| 2021/0197691 | A1 | 7/2021 | Stefanopoulou et al. | |
| 2023/0236842 | A1 * | 7/2023 | Baek ......................... | G06N 3/08 |
| | | | | 713/2 |
| 2023/0411594 | A1 | 12/2023 | Kwon et al. | |
| 2024/0388111 | A1 * | 11/2024 | Yebka ..................... | H02J 7/005 |
| 2025/0087781 | A1 * | 3/2025 | Sun ..................... | H01M 10/425 |
| 2025/0226518 | A1 * | 7/2025 | Han ................... | H01M 50/107 |

OTHER PUBLICATIONS

Zheng, et al., Hands-on Wireless Sensing with Wi-Fi: A Tutorial, Jun. 20, 2022.
Hui, mAP (mean Average Precision) for Object Detection, https://jonathan-hui.medium.com/map-mean-average-precision-for-object-detection-45c121a31173, Mar. 6, 2018.
Güler, et al., DensePose-RCNN System, http://densepose.org/, 2019.
Zheng, et al. Understanding of Channel State Information (CSI), https://link.springer.com/chapter/10.1007/978-981-16-5658-3_2, Jun. 20, 2022 (first on-line Oct. 28, 2021).
European Search Report dated Nov. 29, 2024, of the corresponding EP Patent Application No. 24170563.1.

\* cited by examiner

Jelly Roll
200

Rx Antena
202

Raw CSI Data
204

Phase
sanitization
Algorithm

Outliers
removal

Noise
reduction

Preprocessing
206

Creating a 3D
surface of a jelly roll

Calculating the
percentage of
expansion coefficients

Machine Learning model
208

METHOD, APPARATUS AND COMPUTER-READABLE MEDIUM FOR ESTIMATING STATE OF BATTERY USING RADIO FREQUENCY SIGNAL

CROSS-REFERENCE TO RELATED APPLICATIONS

The present application claims priority and the benefit of Korean Patent Application No. 10-2023-0122659, filed on Sep. 14, 2023, in the Korean Intellectual Property Office, the entire disclosure of which is incorporated herein by reference.

BACKGROUND

1. Field

Embodiments relate to a method and apparatus for estimating a state of a battery by using a radio frequency (RF) signal.

2. Description of the Related Art

Battery state estimation is one of the key considerations in battery management and control. For example, estimating a state of charge (SOC), a state of health (SOH), a state of power (SOP), etc., is of great concern to monitor and maintain the performance of a battery in real time.

In battery state estimation, parameters for battery state determination include voltages, currents, and temperatures of battery cells, and given the importance of battery state monitoring, states of the battery cells are estimated with a small number of factors. Thus, in a technology for guaranteeing the stability of lithium-ion batteries, there are technical limitations in accurately determining abnormal signs regarding the battery cells.

An existing prismatic or circular battery cell is manufactured in a shape of a jelly roll surrounded by a metal case. Thus, there are limitations in a technique for accurately and non-invasively measuring an expansion coefficient of the jelly roll inside the battery cell.

SUMMARY

Embodiments include a method of estimating a state of a battery cell provided in a battery pack. The method may include obtaining, from a radio frequency (RF) antenna provided at opposite ends of the battery cell and configured to transmit and receive an RF signal, data regarding a phase and an amplitude of the RF signal, calculating an expansion coefficient of a jelly roll inside the battery cell based on the data regarding the phase and the amplitude of the RF signal, and estimating a state of the battery cell based on the expansion coefficient of the jelly roll.

In embodiments of the method, obtaining of the data regarding the phase and the amplitude of the RF signal may include transmitting, from an RF antenna transmission unit provided at an end of the battery cell and configured to transmit an RF signal, the RF signal to the battery cell, and receiving data regarding a phase and an amplitude of the RF signal passing through the battery cell at an RF antenna reception unit provided at the other end of the battery cell and configured to receive the RF signal.

In embodiments of the method, the calculating of the expansion coefficient of the jelly roll may include reconstructing, by using a pre-trained deep learning model, an internal structure of the battery cell into three-dimensional (3D) data based on the data regarding the phase and the amplitude of the RF signal, and calculating, by using the pre-trained deep learning model, percentage data of the expansion coefficient of the jelly roll based on the 3D data.

In embodiments of the method, the reconstructing of the internal structure of the battery cell into the 3D data may include reconstructing, by using a pre-trained DensePose model, the internal structure of the battery cell into the 3D data based on the data regarding the phase and the amplitude of the RF signal.

In embodiments of the method, the calculating of the percentage data of the expansion coefficient of the jelly roll includes calculating, by using a pre-trained Mask-RCNN model, the percentage data of the expansion coefficient of the jelly roll based on the 3D data.

In embodiments of the method, the calculating of the expansion coefficient of the jelly roll further includes training a deep learning model based on the 3D data and the data regarding the phase and the amplitude of the RF signal.

In embodiments of the method, estimating of the state of the battery includes estimating an expansion state of the battery cell based on the percentage data of the expansion coefficient of the jelly roll.

Embodiments include an apparatus for estimating a state of a battery cell provided in a battery pack. The apparatus may include a radio frequency (RF) antenna provided at opposite ends of the battery cell and configured to transmit and receive an RF signal, and may include a processor configured to calculate an expansion coefficient of a jelly roll inside the battery cell based on data regarding a phase and an amplitude of the RF signal received from the RF antenna and estimate a state of the battery cell based on the expansion coefficient of the jelly roll.

In embodiments of the apparatus, the RF antenna may include an RF antenna transmission unit provided at an end of the battery cell and configured to transmit an RF signal, and an RF antenna reception unit provided at the other end of the battery cell and configured to receive data regarding a phase and an amplitude of an RF signal.

In embodiments of the apparatus, the processor may be further configured to reconstruct, by using a pre-trained deep learning model, an internal structure of the battery cell into three-dimensional (3D) data based on the data regarding the phase and amplitude of the RF signal and calculate, by using the pre-trained deep learning model, percentage data of the expansion coefficient of the jelly roll based on the 3D data.

In embodiments of the apparatus, the processor may be further configured to reconstruct, by using a pre-trained DensePose model, the internal structure of the battery cell into the 3D data based on the data regarding the phase and amplitude of the RF signal.

In embodiments of the apparatus, the processor may be further configured to calculate, by using a pre-trained Mask-RCNN model, the percentage data of the expansion coefficient of the jelly roll based on the 3D data.

In embodiments of the apparatus, the processor may be further configured to train a deep learning model based on the 3D data and the data regarding the phase and the amplitude of the RF signal.

In embodiments of the apparatus, the processor may be further configured to estimate an expansion state of the battery cell based on the percentage data of the expansion coefficient of the jelly roll.

Embodiments include a non-transitory computer-readable medium storing program code for performing a method of estimating a state of a battery cell provided in a battery pack.

The method may include obtaining, from a radio frequency (RF) antenna provided at opposite ends of the battery cell and configured to transmit and receive an RF signal, data regarding a phase and an amplitude of the RF signal, calculating an expansion coefficient of a jelly roll inside the battery cell based on the data regarding the phase and the amplitude of the RF signal, and estimating a state of the battery cell based on the expansion coefficient of the jelly roll.

BRIEF DESCRIPTION OF THE DRAWINGS

Features will become apparent to those of skill in the art by describing in detail exemplary embodiments with reference to the attached drawings in which:

FIGS. 8 to 10 are views for describing data used in a method of calculating a jelly roll expansion coefficient according to embodiments of the present disclosure; and FIG. 11 is a view for describing a method of training a deep learning model, according to embodiments of the present disclosure.

DETAILED DESCRIPTION

Figure 1:
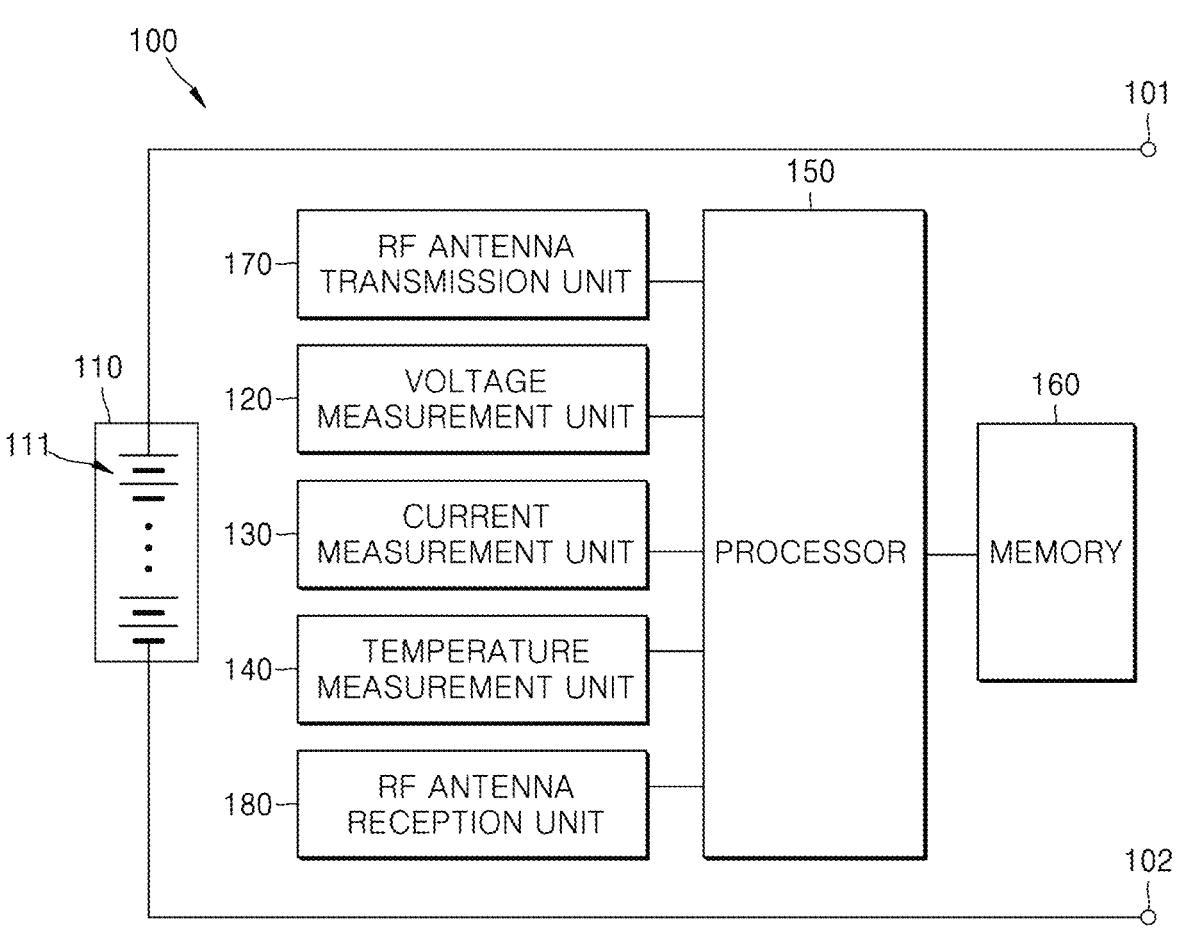
FIG. 1 is a view schematically showing a battery pack according to embodiments of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. It will also be understood that when a layer is referred to as being "between" two layers, it can be the only layer between the two layers, or one or more intervening layers may also be present.

As used herein, the term "and/or" includes any and all combinations of one or more of the associated listed items. Expressions such as "at least one of," when preceding a list of components, modify the entire list of components and do not modify the individual components of the list.

In the description of the examples disclosed herein, the detailed description of the related known technology will be omitted when it is determined to obscure the subject matter of the technical spirit of the present disclosure. Identical or similar components will be given identical reference numerals and will not be repeatedly described.

Throughout the specification, when a component is "connected" to another component, it may include not only a case where they are "directly connected", but also a case where they are "indirectly connected" with another component therebetween. When an element is referred to as "includes" another component, it may mean that the component may further include still another component rather than excluding the still another component unless stated otherwise.

Some examples may be described with functional block configurations and various processing operations. Some or all of the functional blocks may be implemented with various numbers of hardware and/or software configurations. For example, the functional blocks of the present disclosure may be implemented by one or more microprocessors or circuit configurations for certain functions. The functional blocks of the present disclosure may be implemented with various programming or scripting languages. The functional blocks of the present disclosure may be implemented as an algorithm executed on one or more processors. A function performed by a functional block of the present disclosure may be performed by a plurality of functional blocks, or functions performed by a plurality of functional blocks may be performed by one functional block in the present disclosure. Moreover, the present disclosure may employ related art for electronic environment setting, signal processing, and/or data processing, etc.

Figure 2:
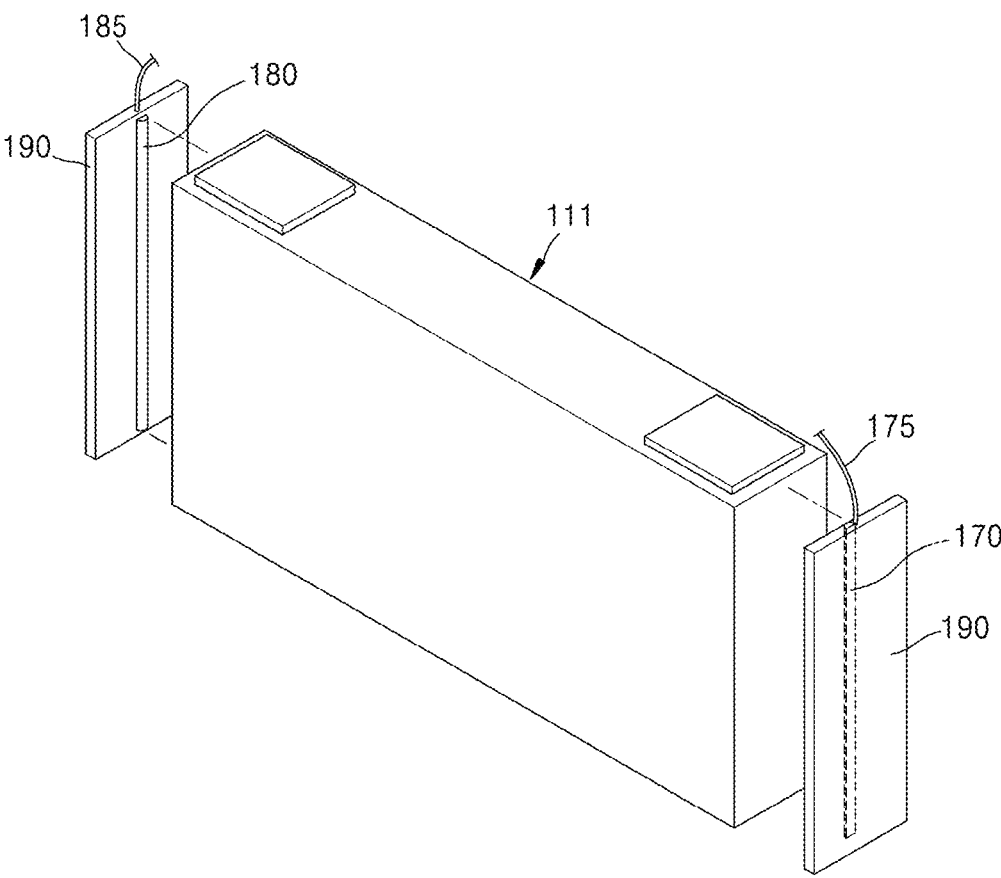
FIGS. 2 and 3 are views for describing a structure of an apparatus for estimating a state of a battery, according to embodiments of the present disclosure.
Figure 3:
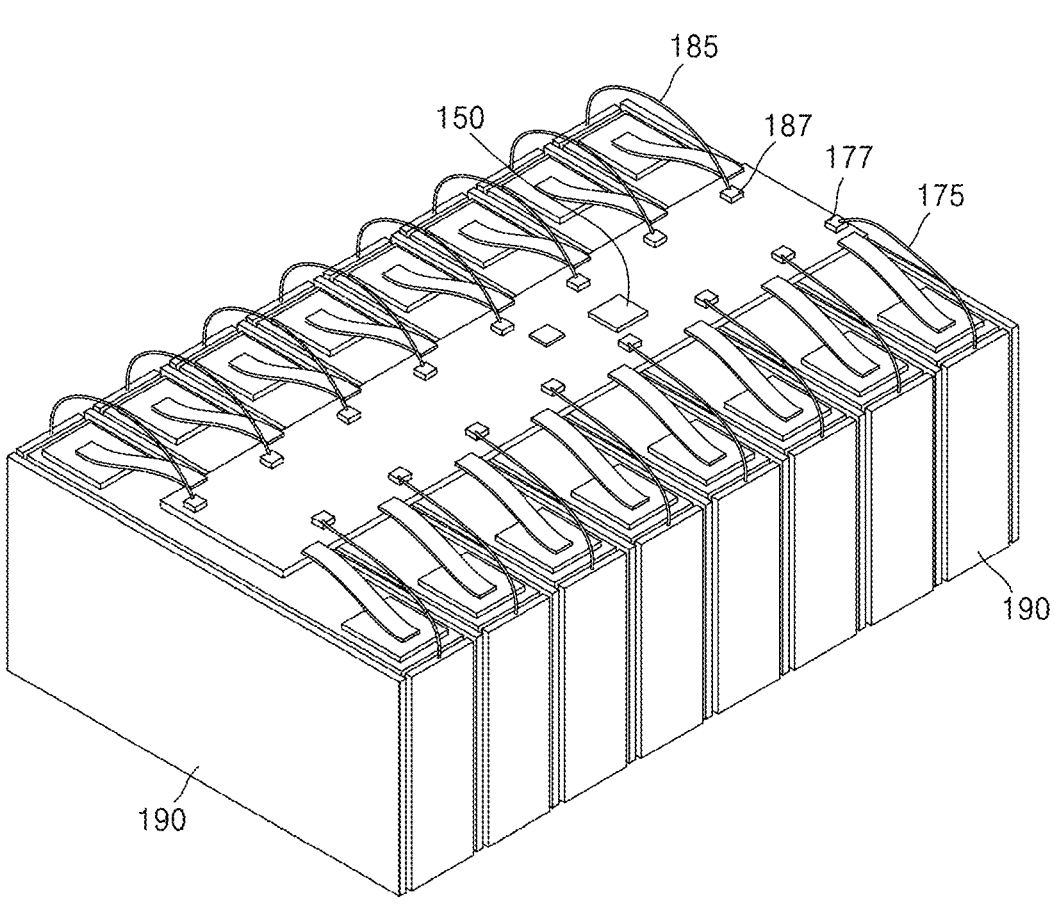

FIG. 1 is a view schematically showing a battery pack according to embodiments of the present disclosure. FIGS. 2 and 3 are views for describing a structure of an apparatus for estimating a state of a battery, according to embodiments of the present disclosure.

Referring to FIG. 1, a battery pack 100 may include a battery module 110, a processor 150, a memory 160, a voltage measurement unit 120, a current measurement unit 130, and a temperature measurement unit 140.

The battery module 110 may include at least one battery cell 111, each of which may be a chargeable secondary battery. In an example embodiment, the battery module 110 may include a lithium-ion battery.

The number of battery cells 111 included in the battery module 110 and a connection scheme thereof may be determined based on a power quantity, a voltage, etc., required for the battery pack 100. In an implementation, the battery cells 111 may be connected in parallel to each other or in parallel and in series to each other. While it is shown in FIG. 1 for conceptual purposes that the battery pack 100 includes one battery module 110, a plurality of battery modules 110 connected in series, in parallel, or in series and in parallel may be included. The battery module 110 may include one battery cell 111.

The battery module 110 may include a plurality of battery modules, each of which may include a plurality of battery cells 111. The battery pack 100 may include a pair of pack terminals 101 and 102 to which an electrical load or a charging device may be connected.

As a target for battery state estimation, in embodiments, a battery may be considered to be the battery module 110 or each of the at least one battery cell 111 included in the battery module 110.

The battery pack 100 according to embodiments of the present disclosure may include a switch. The switch may be connected between the battery module 110 and one of the pack terminals 101 and 102 (e.g., 101). The switch may be controlled by the processor 150. Although not shown in FIG. 1, the battery pack 100 may further include a battery protection circuit, a fuse, a current sensor, and so forth.

The battery pack 100 according to embodiments of the present disclosure may include a radio frequency (RF) antenna.

The RF antenna may be provided at opposite ends of the battery cell 111 to transmit and receive an RF signal. Referring to FIG. 1, the RF antenna according to embodiments of the present disclosure may include an RF antenna transmission unit 170 and an RF antenna reception unit 180.

The RF antenna transmission unit 170 may be provided at an end of the battery cell 111 to transmit an RF signal. The RF antenna reception unit 180 may be provided at the other end of the battery cell 111 to receive data about a phase and an amplitude of the RF signal.

In an embodiment, referring to FIG. 2, examples of the battery cell 111 and the RF antenna according to embodiments of the present disclosure are shown.

The RF antenna transmission unit 170 may be included in an RF signal shielding film 190 provided at an end of the battery cell 111. In an example embodiment, the RF antenna transmission unit 170 may be attached to or buried in the RF signal shielding film 190 provided at an end of the battery cell 111. The RF antenna transmission unit 170 may be connected to a transmission data cable 175. In an example embodiment, referring to FIGS. 2 and 3, the RF antenna transmission unit 170 may be connected to a transmission data terminal 177 provided on a battery management system (BMS) board through the transmission data cable 175 to transmit data to the processor 150.

The RF antenna reception unit 180 may be included in an RF signal shielding film 190 provided at the other end of the battery cell 111. In an example embodiment, the RF antenna reception unit 180 may be attached to or buried in the RF signal shielding film 190 provided at an end of the battery cell 111. The RF antenna reception unit 180 may be connected to a reception data cable 185. In an example embodiment, referring to FIGS. 2 and 3, the RF antenna reception unit 180 may be connected to a reception data terminal 187 provided on a BMS board through the reception data cable 185 to transmit data to the processor 150.

The RF signal shielding film 190 may be provided at opposite ends of the battery cell 111. In an example embodiment, referring to FIG. 3, the RF signal shielding film 190 may be provided on all surfaces including a front surface, a rear surface, a left surface, and a right surface in a form surrounding the battery cell 111.

An apparatus for estimating a state of a battery according to embodiments of the present disclosure may include the processor 150 and the memory 160.

The processor 150 may control an overall operation of the apparatus for the state of the battery. In an example embodiment, the processor 150 may be implemented in the form selectively including a processor, an application-specific integrated circuit (ASIC), another chipset, a logic circuit, a register, a communication modem, and/or a data processing device, etc., known in art to perform the above-described operation.

The processor 150 may perform basic arithmetic, logic, and input/output operations, and execute a program code stored in the memory 160. The processor 150 may store data in the memory 160 or load data stored in the memory 160.

The processor 150 may calculate an expansion coefficient of a jelly roll inside a battery cell based on data about a phase and an amplitude of an RF signal received from an RF antenna to estimate a state of the battery cell based on the calculated expansion coefficient of the jelly roll.

The processor 150 may reconstruct, by using a pre-trained deep learning model, an internal structure of the battery cell into three-dimensional (3D) data based on the data regarding the phase and amplitude of the RF signal, and calculate, by using the pre-trained deep learning model, percentage data of the expansion coefficient of the jelly roll based on the 3D data.

The processor 150 may reconstruct, by using a pre-trained DensePose model, the internal structure of the battery cell into the 3D data based on the data regarding the phase and amplitude of the RF signal.

The processor 150 may calculate, by using a pre-trained Mask-RCNN model, the percentage data of the expansion coefficient of the jelly roll based on the 3D data.

The processor 150 may train the deep learning model based on the 3D data and the data regarding the phase and amplitude of the RF signal.

The processor 150 may estimate an expansion state of the battery cell based on the percentage data of the expansion coefficient of the jelly roll.

The memory 160 may include a permanent mass storage device, such as random access memory (RAM), read only memory (ROM), flash memory, a solid state drive, disk drive, etc. as a recording medium readable by the processor 150. The memory 160 may store an operating system and at least one program or application code. The memory 160 may store a program code for estimating the state of the battery according to embodiments of the present disclosure. The memory 160 may store data generated by measuring at least one parameter of the battery cell 111. The memory 160 may store an intrinsic capacity of the battery cell 111. The memory 160 may store state of charge (SOC)-open circuit voltage (OCV) data of the battery cell 111. In an example embodiment, the data may include a charging/discharging current, a terminal voltage and/or a temperature of the battery. The data may include a discharge rate of the battery. The memory 160 may store program code for estimating a SOC of the battery using the data, generated by measuring the at least one parameter of the battery cell 111, and SOC-OCV data. The at least one parameter of the battery cell 111 may include a component or a variable such as a terminal voltage, a charging/discharging current, and/or an ambient temperature of the battery cell 111. The memory 160 may store the pre-trained deep learning model for calculating the expansion coefficient of the jelly roll of the battery cell 111. The memory 160 may store data regarding the expansion coefficient of the jelly roll. The memory 160 may store program code or data for estimating the state of the battery using the data, generated by calculating the expansion coefficient of the jelly roll of the battery cell 111. In an example embodiment, the state of the battery may include an SOC, a state of health (SOH), etc.

The apparatus for estimating the state of the battery may further include the voltage measurement unit 120, the current measurement unit 130, and the temperature measurement unit 140 to measure at least one parameter of the battery module 110. The apparatus for estimating the state of the battery may further include a communication module for communication with another device such as an electronic control device of a vehicle, a controller of a charging device, etc.

The voltage measurement unit 120 may be configured to measure a voltage of the battery module 110. In an example embodiment, as shown in a configuration of FIG. 1, the voltage measurement unit 120 may be electrically connected to opposite ends of the battery module 110. The voltage measurement unit 120 may be electrically connected to the processor 150 to exchange electrical signals. The voltage measurement unit 120 may measure a voltage across the opposite ends of the battery module 110 at time intervals and output a signal indicating a magnitude of the measured voltage to the processor 150, under control of the processor 150. The processor 150 may determine the voltage of the battery module 110 from the signal output from the voltage measurement unit 120. In an example embodiment, the voltage measurement unit 120 may be implemented using a voltage measurement circuit generally used in the art.

The current measurement unit 130 may be configured to measure the current of the battery. In an example embodiment, as shown in the configuration of FIG. 1, the current measurement unit 130 may be electrically connected to a current sensor included in a charging/discharging path of the battery module 110. The current measurement unit 130 may be electrically connected to the processor 150 to exchange electrical signals. The current measurement unit 130 may repeatedly measure a magnitude of charging current or discharging current of the battery module 110 at time intervals and output a signal indicating a magnitude of the measured current to the processor 150, under control of the processor 150. The processor 150 may determine the magnitude of the current from the signal output from the current measurement unit 130. In an example embodiment, the current sensor may be implemented using a hall sensor or a sense resistor generally used in the art.

The temperature measurement unit 140 may be configured to measure the temperature of the battery. In an example embodiment, as shown in the configuration of FIG. 1, the temperature measurement unit 140 may be connected to the battery module 110 to measure a temperature of a secondary battery included in the battery module 110. The temperature measurement unit 140 may be electrically connected to the processor 150 to exchange electrical signals. The temperature measurement unit 140 may repeatedly measure the temperature of the secondary battery at time intervals and output a signal indicating a magnitude of the measured temperature to the processor 150. The processor 150 may determine the temperature of the secondary battery from the signal output from the temperature measurement unit 140. In an example embodiment, the temperature measurement unit 140 may be implemented using a thermocouple generally used in the art.

The processor 150 may estimate the state of the battery module 110 by using at least one of a voltage measurement value, a current measurement value, and a temperature measurement value of the battery module 110, received from the voltage measurement unit 120, the current measurement unit 130, and the temperature measurement unit 140, respectively. In an example embodiment, the processor 150 may estimate an SOC of the battery module 110. In embodiments, the SOC may be calculated as a value corresponding to the remaining capacity of the battery module 110 in a range of 0 to 100%.

In embodiments of the present disclosure, the processor 150 may estimate the SOC of the battery module 110 by integrating the charging/discharging current of the battery module 110. In an example implementation, if charging or discharging of the battery module 110 starts, an initial value of an SOC may be determined using an OCV of the battery module 110 measured before start of the charging or discharging. To this end, the processor 150 may map, based on SOC-OCV data defining an SOC for each OCV, an SOC corresponding to the OCV of the battery module 110 from the SOC-OCV data.

In embodiments of the present disclosure, the processor 150 may estimate the SOC of the battery module 110 by using an extended Kalman filter. The extended Kalman filter may refer to a mathematical algorithm that adaptively estimates an SOC of a secondary battery by using a voltage, a current, and a temperature of the secondary battery. The SOC of the battery module 110 may be determined by another known method for estimating an SOC by selectively using a voltage, a current, and a temperature of a secondary battery as well as the above-described current integration method or extended Kalman filter.

In an example embodiment, the processor 150 may compare the state of the battery, estimated using the expansion coefficient of the jelly roll, with the state of the battery, estimated using the current, the voltage, and the temperature. In an example implementation, the processor 150 may train the deep learning model by using the state of the battery, estimated using the expansion coefficient of the jelly roll, and the state of the battery, estimated using the current, the voltage, and the temperature.

Figure 4:
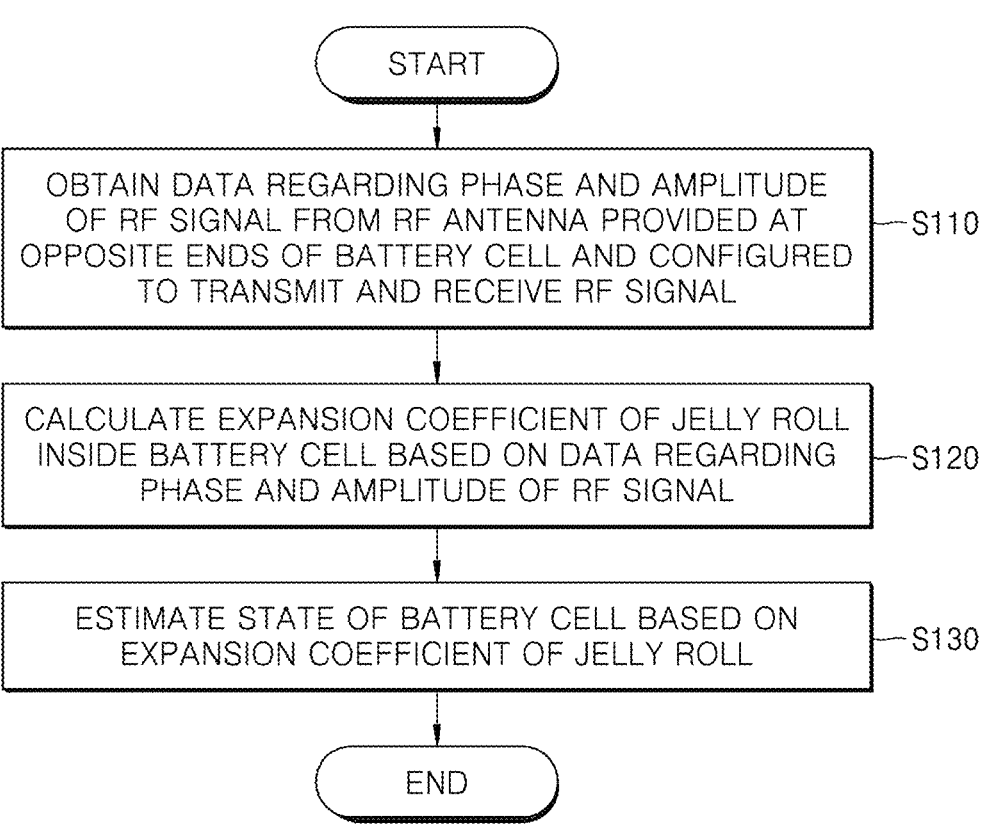
FIG. 4 is a flowchart of a method of estimating a state of a battery according to embodiments of the present disclosure.
Figure 5:
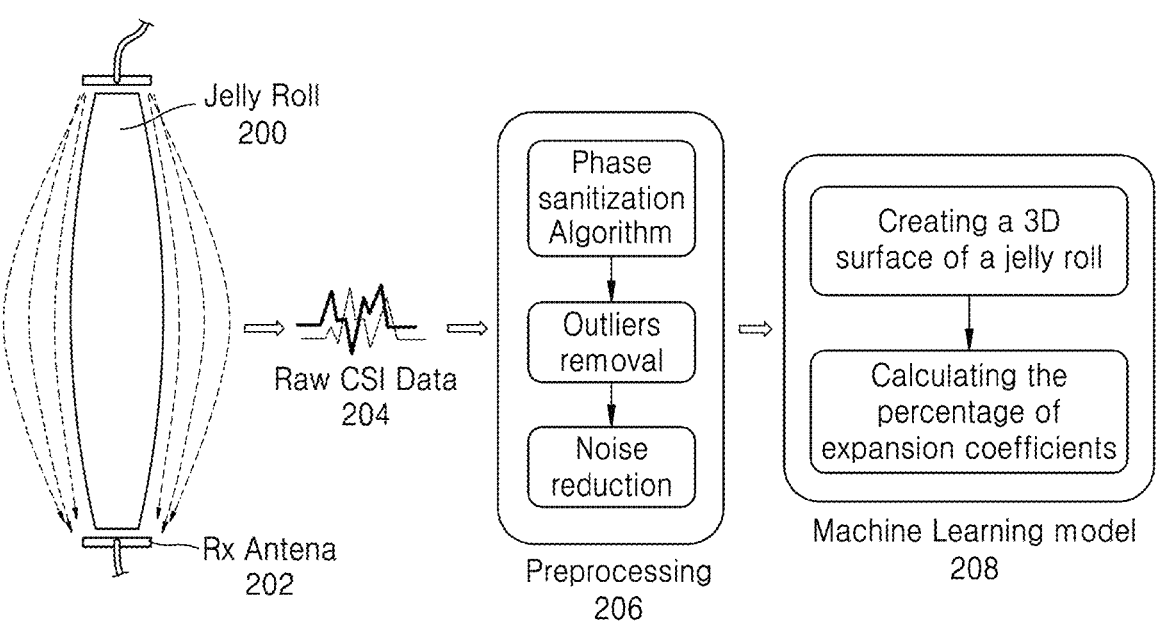
FIG. 5 is a view for describing a method of estimating a state of a battery according to embodiments of the present disclosure.
Figure 6:
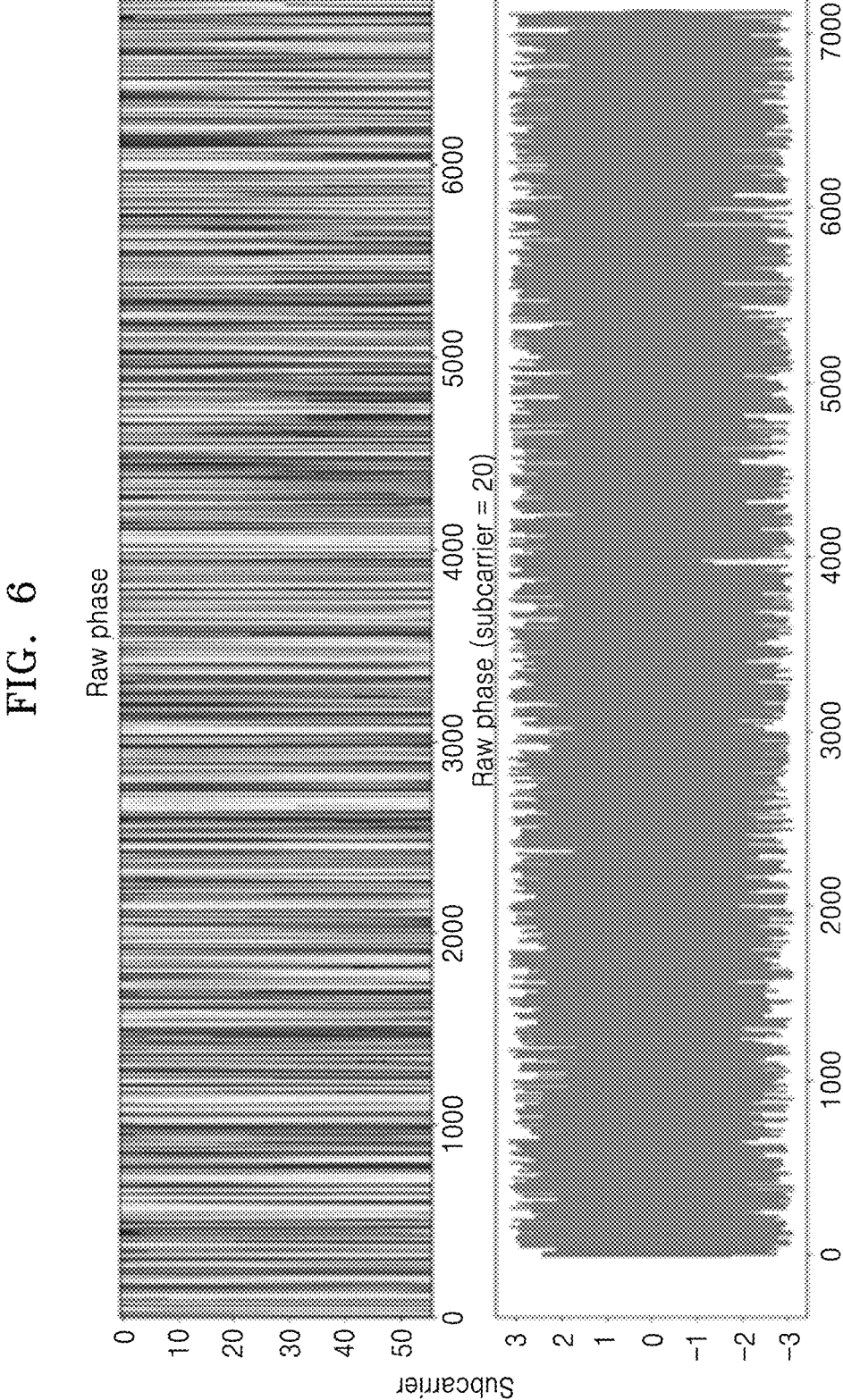
FIG. 6 is a pair of graphs for describing amplitude and phase data of a radio frequency (RF) signal according to embodiments of the present disclosure.

FIG. 4 is a flowchart of a method of estimating a state of a battery according to embodiments of the present disclosure. FIG. 5 is a view for describing a method of estimating a state of a battery according to embodiments of the present disclosure, and FIG. 6 is a pair of graphs for describing amplitude and phase data of an RF signal according to embodiments of the present disclosure.

Referring to FIG. 4, in operation S110, the processor may obtain the data regarding the phase and amplitude of the RF signal from the RF antenna provided at the opposite ends of the battery cell and configured to transmit and receive the RF signal.

In operation S120, the processor may calculate the expansion coefficient of the jelly roll inside the battery cell, based on the data regarding the phase and amplitude of the RF signal.

The processor according to embodiments of the present disclosure may reconstruct, by using the pre-trained deep learning model, the internal structure of the battery cell into the 3D data based on the data regarding the phase and amplitude of the RF signal. The processor may calculate, by using the pre-trained deep learning model, the percentage data of the expansion coefficient of the jelly roll based on the 3D data.

The processor according to embodiments of the present disclosure may reconstruct, by using the pre-trained Dense-Pose model, the internal structure of the battery cell into the 3D data based on the data regarding the phase and amplitude of the RF signal.

The processor according to embodiments of the present disclosure may calculate, by using the pre-trained Mask-RCNN model, the percentage data of the expansion coefficient of the jelly roll based on the 3D data.

The processor according to embodiments of the present disclosure may train the deep learning model based on the 3D data and the data regarding the phase and amplitude of the RF signal.

In operation S130, the processor may estimate the state of the battery cell based on the expansion coefficient of the jelly roll. In an example embodiment, the processor may estimate an expansion state of the battery cell based on the percentage data of the expansion coefficient of the jelly roll.

The method of estimating the state of the battery according to embodiments of the present disclosure may involve a method of measuring the expansion coefficient of the jelly roll at opposite ends of the prismatic battery case by using the RF antenna and deep learning. This method may be used to reconstruct the internal structure of the battery cell three-dimensionally by using DensePose and Mask-RCNN and accurately measure the expansion state of the jelly roll through the reconstruction.

In an example embodiment, referring to FIG. 5, the RF antenna transmission unit and the RF antenna reception unit may be arranged at opposite ends of a lithium-ion battery cell including a jelly roll 200.

The RF antenna 202 transmission unit may output an RF signal, and the RF antenna reception unit may obtain a channel state information (CSI) value of the RF signal. In an example embodiment, the CSI value may indicate complex numbers representing the amplitude and phase of the RF signal on different subcarriers. In an example embodiment, the CSI value may indicate a value indicating characteristics of a wireless channel and may include amplitude and phase information 204 of the RF signal. The CSI data may then be preprocessed 206 to remove unnecessary data, then use the machine learning model 208 to create a 3D surface of the jelly roll and calculating the percentage of expansion coefficients. These values may indicate how a radio signal changes while interacting with an environment, and information about a physical environment may be extracted from them. In an example embodiment, referring to FIG. 6, example graphs of data regarding a phase and amplitude of an RF signal according to embodiments of the present disclosure are shown.

During charging or discharging of the battery cell, the jelly roll of the battery cell may expand or contract due to breathing or swelling. Expansion or contraction of the jelly roll may affect the RF signal passing through or reflected from the battery cell, thus generating a unique pattern in a CSI value. In an example embodiment, the unique pattern of the CSI value may indicate a pattern indicating how the RF signal changes while interacting with the environment. In an example embodiment, if a signal is reflected from a wall or object or interferes with another signal, the CSI value may have a specific pattern. The pattern of the CSI value may reflect the characteristics of the radio channel, and thus may be analyzed to extract information about the physical environment or detect a particular event.

The data regarding the phase and amplitude of the RF signal according to embodiments of the present disclosure may be provided to the pre-trained deep learning model. In an example embodiment, the data regarding the phase and amplitude of the RF signal may be provided to the deep learning model through a pre-processing operation of removing unnecessary data (see FIG. 5).

The pre-trained deep learning model according to embodiments of the present disclosure may generate a 3D surface of the jelly roll and calculate the percentage of the expansion coefficient of the jelly roll by using the same. In an example embodiment, the pre-trained deep learning model according to embodiments of the present disclosure may output the expansion degree of the jelly roll as a percentage with respect to the original size. In an example embodiment, the expansion coefficient of the jelly roll may be used to monitor the SOH and SOC of the battery cell and detect abnormal operation or performance degradation of the battery cell.

Figure 7:
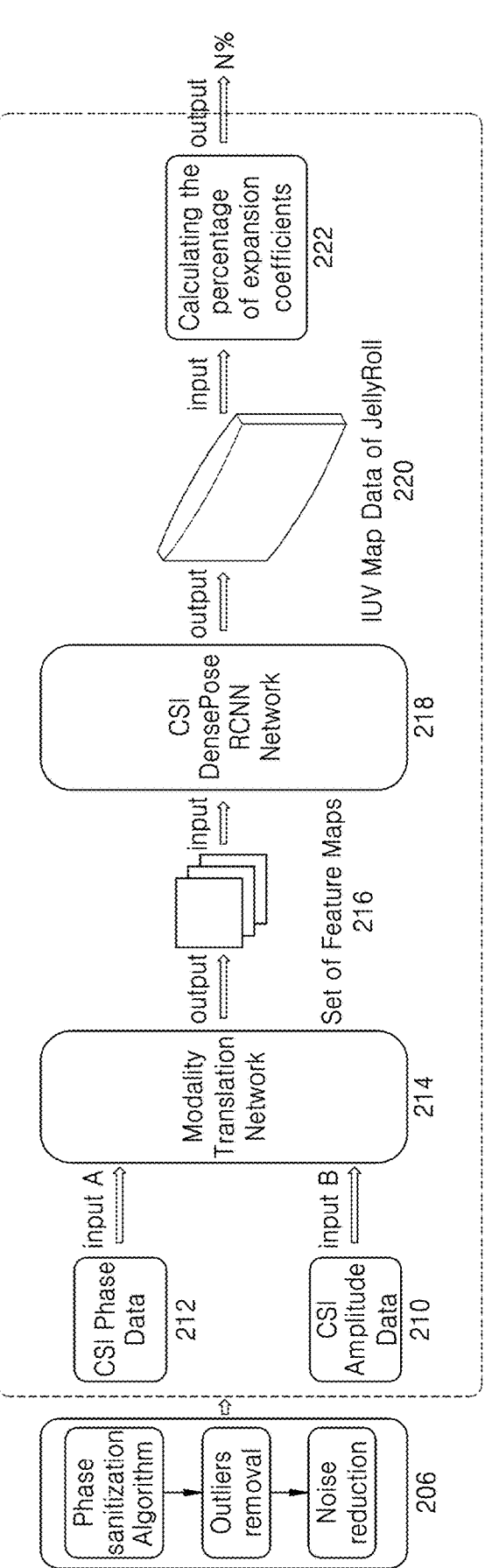
FIG. 7 is a view for describing a method of calculating a jelly roll expansion coefficient, according to embodiments of the present disclosure.

FIG. 7 is a view for describing a method of calculating a jelly roll expansion coefficient, according to embodiments of the present disclosure. FIGS. 8 to 10 are views for describing data used for a method of calculating a jelly roll expansion coefficient according to embodiments of the present disclosure.

Referring to FIG. 7, a flowchart for calculating the expansion coefficient of the jelly roll by using the deep learning model according to embodiments of the present disclosure is shown.

The present disclosure may use a deep learning model that uses, as an input, data regarding a phase and an amplitude of an RF signal collected by an RF antenna installed at opposite ends of a battery cell.

The data regarding the phase and amplitude of the RF signal according to embodiments of the present disclosure may be expressed as a tensor (a multidimensional array). In an example embodiment, the tensor may include 5 successive CSI measurement values, 30 frequencies distributed linearly around 2.4 GHz, and information corresponding to a transmitter and a receiver. Such sensor data may be used as an input to the deep learning model.

In an embodiment, referring to FIG. 8, an example of phase tensor data of 2*3*2*2 tensors simulating 2 consecutive samples, 3 frequencies, 2 transmitters, and 2 receivers are shown. In another embodiment, referring to FIG. 9, an example of amplitude tensor data of 2*3*2*2 tensors simulating 2 consecutive samples, 3 frequencies, 2 transmitters, and 2 receivers are shown.

The data regarding the phase and amplitude of the RF signal may be input to a multilayer perceptron (MLP) to extract features in a CSI latent space. These features may indicate the inner state of the battery cell. The features extracted from the amplitude 210 and phase 212 may be combined, in embodiments, using a modality translation network 214 to be expressed as one tensor that may be converted into a two-dimensional (2D) feature map 216.

The 2D feature map converted in the previous operation may be input to the DensePose-RCNN model 218 to output a 3D UV map 220 for estimating the expansion coefficient of the jelly roll. As one skilled in the art will know, a UV map is the flat surface representation of a 3D model used to wrap textures. The process of creating a UV map is known as UV unwrapping, which may be done using 3D modeling software. The letters U and V are used to define UV mapping because it signifies the axis of the 2D texture on the UV grid.

The deep learning model according to embodiments of the present disclosure may map the RF signal to UV coordinates of a 3D battery cell model by using the DensePose technique. In this way, the present disclosure may reconstruct the jelly roll structure inside the battery cell three-dimensionally.

The deep learning model according to embodiments of the present disclosure may detect the boundary of the jelly roll in the reconstructed 3D battery cell model by using the Mask-RCNN technique and thus measure the expansion state of the jelly roll. This method may provide segmentation at a pixel level of each jelly roll layer, enabling high-accuracy measurement of the expansion state of the jelly roll.

In an example embodiment, referring to FIG. 10, an example of UV map tensor data of 25*112*112 tensors for 24 jelly roll body parts and background is shown. (shortened to 3*4*4)

Calculation of the percentage of the expansion coefficient 222 of the jelly roll according to embodiments of the present disclosure may include calculating the percentage of the expansion coefficient of the jelly roll by calculating a relative value through comparison between UV values of the jelly roll, respectively measured for expansion coefficients of 0% and 100%.

Figure 11:
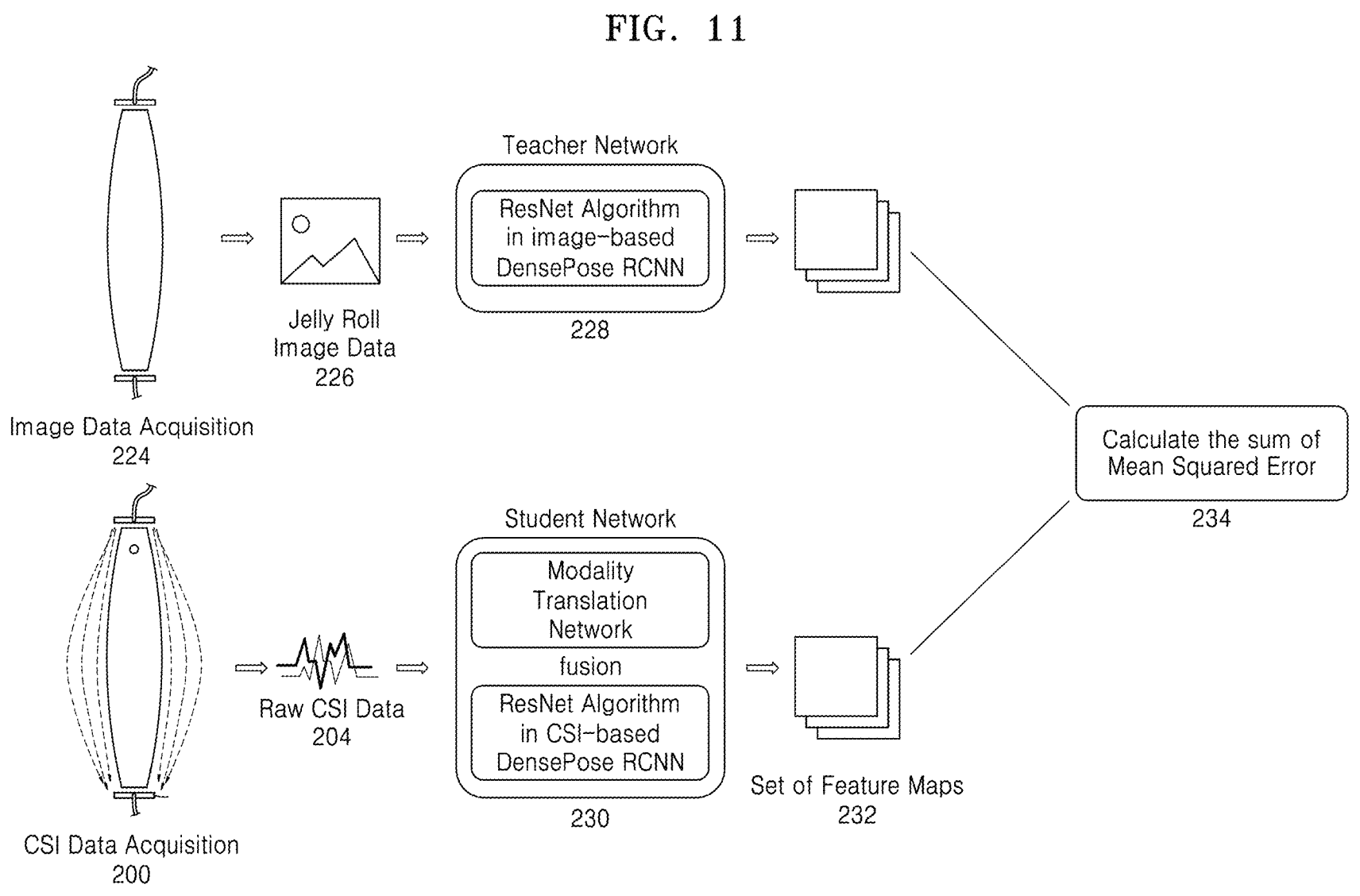

FIG. 11 is a view for describing a method of training a deep learning model, according to embodiments of the present disclosure.

Referring to FIG. 11, the deep learning model according to embodiments of the present disclosure may be trained based on jelly roll 224 image data 226 and data regarding phase and amplitude of an RF signal 204.

In an example embodiment, the deep learning model according to embodiments of the present disclosure may be trained by establishing a teacher network 228 based on the battery jelly roll image data or 3D data and establishing a student network 230 based on the data regarding the phase and amplitude of the RF signal. The feature maps 232 produced by the teacher network 228 and the student network 230 may be used to calculate the sum of the mean squared error 234.

According to the present disclosure, key information required for evaluating the safety of the battery cells and predicting the lifetime of the battery cells may be provided. The present disclosure may measure the expansion state of the battery cells more accurately, faster, and with lower costs than existing methods, thereby improving quality control and production efficiency for the battery cells. The present disclosure may be used in various fields such as manufacturing and management of the battery cells, safety evaluation and lifetime prediction of the battery cells, etc.

The various embodiments described above are illustrative and are not to be independently implemented separately from each other. Embodiments described herein may be implemented in combination with each other.

Various embodiments of the present disclosure may be implemented in the form of a computer program executable on a computer through various components, and the computer program may be recorded on a non-transitory computer-readable medium. The medium may continuously store an executable program or temporarily store the same for execution or downloading. The medium may include various recording means or storage means in a form of single hardware or a combination of several hardware, and may be distributed over a network without being limited to a medium directly connected to a certain computer system. Examples of the medium may include a magnetic medium such as a hard disk, a floppy disk, and a magnetic tape, an optical recording medium such as a CD-ROM and a DVD, a magneto-optical medium such as a floptical disk, ROM, RAM, flash memory or other types of solid state memory, etc., to store a program instruction. Other examples of the medium may include a recording medium or a storage medium managed by an app store that distributes applications, a site that supplies or distributes various software, a server, etc.

In the specification, the term "unit", "module", etc., may be a hardware component like a processor or a circuit, and/or a software component executed by a hardware component like a processor. In embodiments, "unit", "module", etc., may be implemented by components such as software components, object-oriented software components, class components, and task components, processes, functions, properties, procedures, subroutines, segments of program code, drivers, firmware, microcode, circuits, data, a database, data structures, tables, arrays, and variables.

In embodiments, each element described as a single type may be implemented in a distributed manner, and likewise, elements described as being distributed may be implemented as a coupled type.

The scope of the present disclosure is defined by the following claims rather than the detailed description, and the meanings and scope of the claims and all changes or modified forms derived from their equivalents should be construed as falling within the scope of the present disclosure.

According to the present disclosure, by measuring the expansion coefficient of the jelly roll inside a battery cell (e.g., a lithium-ion battery cell) by using the RF signal and applying the same to the BMS, compared to a conventional case using factors like a voltage, a current, a temperature, etc., for battery cell state estimation, the non-invasively measured expansion coefficient of the jelly roll may be used as a factor, thereby improving the accuracy of battery cell state estimation and enhancing the safety of the battery pack. However, the scope of the present disclosure is not limited by these effects.

One or more embodiments include a method and apparatus for estimating a state of a battery by using a radio frequency (RF) signal. However, such a problem is just an example, and the scope of the present disclosure is not limited thereto.

According to one or more embodiments, a method of estimating a state of a battery cell provided in a battery pack includes obtaining, from a radio frequency (RF) antenna provided at opposite ends of the battery cell and configured to transmit and receive an RF signal, data regarding a phase and an amplitude of the RF signal, calculating an expansion coefficient of a jelly roll inside the battery cell based on the data regarding the phase and the amplitude of the RF signal, and estimating a state of the battery cell based on the expansion coefficient of the jelly roll.

According to an example embodiment, the obtaining of the data regarding the phase and the amplitude of the RF signal includes transmitting, from an RF antenna transmission unit provided at an end of the battery cell and configured to transmit an RF signal, the RF signal to the battery cell and receiving data regarding a phase and an amplitude of the RF signal passing through the battery cell at an RF antenna reception unit provided at the other end of the battery cell and configured to receive the RF signal.

According to another example embodiment, the calculating of the expansion coefficient of the jelly roll includes reconstructing, by using a pre-trained deep learning model, an internal structure of the battery cell into three-dimensional (3D) data based on the data regarding the phase and the amplitude of the RF signal and calculating, by using the pre-trained deep learning model, percentage data of the expansion coefficient of the jelly roll based on the 3D data.

According to another example embodiment, the reconstructing of the internal structure of the battery cell into the 3D data may include reconstructing, by using a pre-trained DensePose model, the internal structure of the battery cell into the 3D data based on the data regarding the phase and the amplitude of the RF signal.

According to another example embodiment, the calculating of the percentage data of the expansion coefficient of the jelly roll may include calculating, by using a pre-trained Mask-RCNN model, the percentage data of the expansion coefficient of the jelly roll based on the 3D data.

According to another example embodiment, the calculating of the expansion coefficient of the jelly roll may further include training a deep learning model based on the 3D data and the data regarding the phase and the amplitude of the RF signal.

According to another example embodiment, the estimating of the state of the battery may include estimating an expansion state of the battery cell based on the percentage data of the expansion coefficient of the jelly roll.

According to one or more embodiments, a computer program is stored on a recording medium to execute the above-described method on a computing device.

According to one or more embodiments, an apparatus for estimating a state of a battery cell provided in a battery pack includes a radio frequency (RF) antenna provided at opposite ends of the battery cell and configured to transmit and receive an RF signal and a processor configured to calculate an expansion coefficient of a jelly roll inside the battery cell based on data regarding a phase and an amplitude of the RF signal received from the RF antenna and estimate a state of the battery cell based on the expansion coefficient of the jelly roll.

According to an example embodiment, the RF antenna may include an RF antenna transmission unit provided at an end of the battery cell and configured to transmit an RF signal and an RF antenna reception unit provided at the other end of the battery cell and configured to receive data regarding a phase and an amplitude of an RF signal.

According to another example embodiment, the processor may be further configured to reconstruct, by using a pre-trained deep learning model, an internal structure of the battery cell into three-dimensional (3D) data based on the data regarding the phase and amplitude of the RF signal and calculate, by using the pre-trained deep learning model, percentage data of the expansion coefficient of the jelly roll based on the 3D data.

According to another example embodiment, the processor may be further configured to reconstruct, by using a pre-trained DensePose model, the internal structure of the battery cell into the 3D data based on the data regarding the phase and amplitude of the RF signal.

According to another example embodiment, the processor may be further configured to calculate, by using a pre-trained Mask-RCNN model, the percentage data of the expansion coefficient of the jelly roll based on the 3D data.

According to another example embodiment, the processor may be further configured to train a deep learning model based on the 3D data and the data regarding the phase and the amplitude of the RF signal.

According to another example embodiment, the processor may be further configured to estimate an expansion state of the battery cell based on the percentage data of the expansion coefficient of the jelly roll.

Descriptions of features or elements within each embodiment should typically be considered as available for other similar features or elements in other embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Thus, it will be understood by those of skill in the art that various changes in form and details may be made without departing from the spirit and scope of the present invention as set forth in the following claims.

What is claimed is:

1. A method of estimating a state of a battery cell provided in a battery pack, the method comprising:

obtaining, from a radio frequency (RF) antenna provided at opposite ends of the battery cell and configured to transmit and receive an RF signal, data regarding a phase and an amplitude of the RF signal, wherein the obtaining includes:

transmitting, from an RF antenna transmission unit provided at an end of the battery cell and configured to transmit an RF signal, the RF signal to the battery cell; and receiving data regarding a phase and an amplitude of the RF signal passing through the battery cell at an RF antenna reception unit provided at the other end of the battery cell and configured to receive the RF signal;

calculating an expansion coefficient of a jelly roll inside the battery cell based on the data regarding the phase and the amplitude of the RF signal; and estimating a state of the battery cell based on the expansion coefficient of the jelly roll.

2. The method as claimed in claim 1, wherein the calculating of the expansion coefficient of the jelly roll includes:

reconstructing, by using a pre-trained deep learning model, an internal structure of the battery cell into three-dimensional (3D) data based on the data regarding the phase and the amplitude of the RF signal; and calculating, by using the pre-trained deep learning model, percentage data of the expansion coefficient of the jelly roll based on the 3D data.

3. The method as claimed in claim 2, wherein the reconstructing of the internal structure of the battery cell into the 3D data includes reconstructing, by using a pre-trained DensePose model, the internal structure of the battery cell into the 3D data based on the data regarding the phase and the amplitude of the RF signal.

4. The method as claimed in claim 2, wherein the calculating of the percentage data of the expansion coefficient of the jelly roll includes calculating, by using a pre-trained Mask-RCNN model, the percentage data of the expansion coefficient of the jelly roll based on the 3D data.

5. The method as claimed in claim 2, wherein the calculating of the expansion coefficient of the jelly roll further includes training a deep learning model based on the 3D data and the data regarding the phase and the amplitude of the RF signal.

6. The method as claimed in claim 2, wherein the estimating of the state of the battery cell includes estimating an expansion state of the battery cell based on the percentage data of the expansion coefficient of the jelly roll.

7. An apparatus for estimating a state of a battery cell provided in a battery pack, the apparatus comprising:

a radio frequency (RF) antenna provided at opposite ends of the battery cell and configured to transmit and receive an RF signal;

a processor configured to calculate an expansion coefficient of a jelly roll inside the battery cell based on data regarding a phase and an amplitude of the RF signal received from the RF antenna and estimate a state of the battery cell based on the expansion coefficient of the jelly roll, an RF antenna transmission unit provided at an end of the battery cell and configured to transmit an RF signal; and an RF antenna reception unit provided at the other end of the battery cell and configured to receive data regarding a phase and an amplitude of an RF signal.

8. The apparatus as claimed in claim 7, wherein the processor is further configured to reconstruct, by using a pre-trained deep learning model, an internal structure of the battery cell into three-dimensional (3D) data based on the data regarding the phase and amplitude of the RF signal and calculate, by using the pre-trained deep learning model, percentage data of the expansion coefficient of the jelly roll based on the 3D data.

9. The apparatus as claimed in claim 8, wherein the processor is further configured to reconstruct, by using a pre-trained DensePose model, the internal structure of the battery cell into the 3D data based on the data regarding the phase and amplitude of the RF signal.

10. The apparatus as claimed in claim 8, wherein the processor is further configured to calculate, by using a pre-trained Mask-RCNN model, the percentage data of the expansion coefficient of the jelly roll based on the 3D data.

11. The apparatus as claimed in claim 8, wherein the processor is further configured to train a deep learning model based on the 3D data and the data regarding the phase and the amplitude of the RF signal.

12. The apparatus as claimed in claim 8, wherein the processor is further configured to estimate an expansion state of the battery cell based on the percentage data of the expansion coefficient of the jelly roll.

13. A non-transitory computer-readable medium storing program code for performing a method of estimating a state of a battery cell provided in a battery pack, the method comprising:

obtaining, from a radio frequency (RF) antenna provided at opposite ends of the battery cell and configured to transmit and receive an RF signal, data regarding a phase and an amplitude of the RF signal, wherein the obtaining includes:

transmitting, from an RF antenna transmission unit provided at an end of the battery cell and configured to transmit an RF signal, the RF signal to the battery cell; and receiving data regarding a phase and an amplitude of the RF signal passing through the battery cell at an RF antenna reception unit provided at the other end of the battery cell and configured to receive the RF signal;

calculating an expansion coefficient of a jelly roll inside the battery cell based on the data regarding the phase and the amplitude of the RF signal; and estimating a state of the battery cell based on the expansion coefficient of the jelly roll.

* * * * *